(12) United States Patent
Minn et al.

(10) Patent No.: US 9,164,543 B2
(45) Date of Patent: Oct. 20, 2015

(54) LEASH FOR AN ELECTRONIC DEVICE

(75) Inventors: Kenneth Y Minn, San Francisco, CA (US); David E Yao, San Francisco, CA (US); Michael C Huang, San Francisco, CA (US)

(73) Assignee: KENU, INC., San Francisco, CA (US)

( * ) Notice: Subject to any disclaimer, the term of this patent is extended or adjusted under 35 U.S.C. 154(b) by 0 days.

(21) Appl. No.: 13/316,376

(22) Filed: Dec. 9, 2011

(65) Prior Publication Data

US 2013/0148295 A1  Jun. 13, 2013

(51) Int. Cl.
*G06F 1/16* (2006.01)
*A45F 5/02* (2006.01)
*A45F 5/00* (2006.01)
*H02G 11/00* (2006.01)

(52) U.S. Cl.
CPC . *G06F 1/163* (2013.01); *A45F 5/02* (2013.01); *A45F 2005/006* (2013.01); *A45F 2005/008* (2013.01); *H02G 11/00* (2013.01); *Y10T 24/1397* (2015.01)

(58) Field of Classification Search
CPC ................................ G06F 1/163; H02G 11/00
USPC .................................... 24/298, 300–302, 3.13
See application file for complete search history.

(56) References Cited

U.S. PATENT DOCUMENTS

| 3,165,804 | A | | 1/1965 | Andre |
| D253,676 | S | | 12/1979 | Mathieson |
| D292,543 | S | | 11/1987 | Smith |
| D292,750 | S | | 11/1987 | Smith |
| 4,908,607 | A | * | 3/1990 | Yannotti et al. ............... 340/571 |
| 5,119,419 | A | * | 6/1992 | McDaid ........................ 379/445 |
| 5,406,809 | A | * | 4/1995 | Igelmund ............................ 70/2 |
| 5,655,270 | A | * | 8/1997 | Boisvert .......................... 24/336 |
| D388,729 | S | | 1/1998 | Bulgari |
| D418,774 | S | | 1/2000 | Kalbach |
| 6,419,135 | B1 | * | 7/2002 | Sali ............................... 224/610 |
| 6,427,374 | B1 | * | 8/2002 | Vaiani ............................. 42/85 |
| 6,493,910 | B1 | * | 12/2002 | Dischler ......................... 24/712 |
| 6,860,049 | B2 | | 3/2005 | Bagnara |
| 6,883,694 | B2 | * | 4/2005 | Abelow ......................... 224/666 |
| D520,738 | S | | 5/2006 | Tarantino |
| 7,178,205 | B2 | * | 2/2007 | Nessel et al. ..................... 24/289 |
| 7,458,238 | B2 | * | 12/2008 | Stolk et al. ........................ 70/18 |
| 7,594,305 | B2 | * | 9/2009 | Moore ............................ 24/299 |
| 7,909,651 | B2 | * | 3/2011 | Kim et al. ...................... 439/638 |
| 8,376,239 | B1 | * | 2/2013 | Humphrey .................... 235/493 |
| 2002/0142633 | A1 | * | 10/2002 | Inagawa ......................... 439/98 |
| 2002/0177357 | A1 | * | 11/2002 | Inui ............................... 439/502 |

(Continued)

*Primary Examiner* — Robert J Sandy
*Assistant Examiner* — David Upchurch
(74) *Attorney, Agent, or Firm* — Troutman Sanders LLP

(57) ABSTRACT

One embodiment of the leash for an electronic device, with a data port, comprises: a connector; a singular cord; an elastomeric coating; a protective element; and a washer. The connector includes a broad face, an insertable member adjacent to the broad face and configured to engage the data port, and a latch configured to selectively lock the insertable member to the data port. The singular cord includes a first and second end and defines a spring-loop junction therebetween, wherein the second end is arranged proximal to the spring-loop junction to form a loop. The elastomeric coating is arranged over the cord between the first end and the spring-loop junction and defines a spring section therebetween. The protective element is arranged over the spring-loop junction and the second end of the cord. The washer couples the first end to the connector, the cord extending from the broad face of the connector.

20 Claims, 7 Drawing Sheets

(56) References Cited

U.S. PATENT DOCUMENTS

| | | | |
|---|---|---|---|
| 2003/0151510 A1* | 8/2003 | Quintana et al. | 340/568.2 |
| 2006/0225253 A1* | 10/2006 | Bates | 24/3.13 |
| 2007/0091557 A1* | 4/2007 | Kim et al. | 361/683 |
| 2007/0277352 A1* | 12/2007 | Maron et al. | 24/298 |
| 2008/0025524 A1* | 1/2008 | Vaudrey et al. | 381/72 |
| 2008/0222849 A1* | 9/2008 | Lavoie | 24/3.13 |
| 2009/0104945 A1* | 4/2009 | Axelsson | 455/569.1 |
| 2009/0301761 A1* | 12/2009 | Wu | 174/250 |
| 2010/0005632 A1* | 1/2010 | Pigozzi | 24/3.13 |
| 2010/0104126 A1* | 4/2010 | Greene | 381/384 |
| 2010/0122435 A1* | 5/2010 | Markham | 24/3.11 |
| 2010/0133306 A1* | 6/2010 | Monroe | 224/219 |
| 2010/0158453 A1* | 6/2010 | Cody et al. | 385/100 |
| 2012/0295462 A1* | 11/2012 | Villarreal et al. | 439/304 |

* cited by examiner

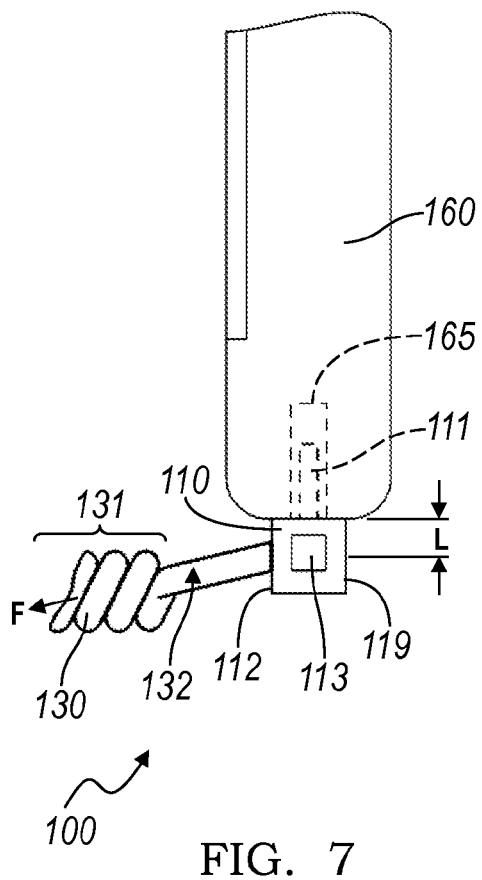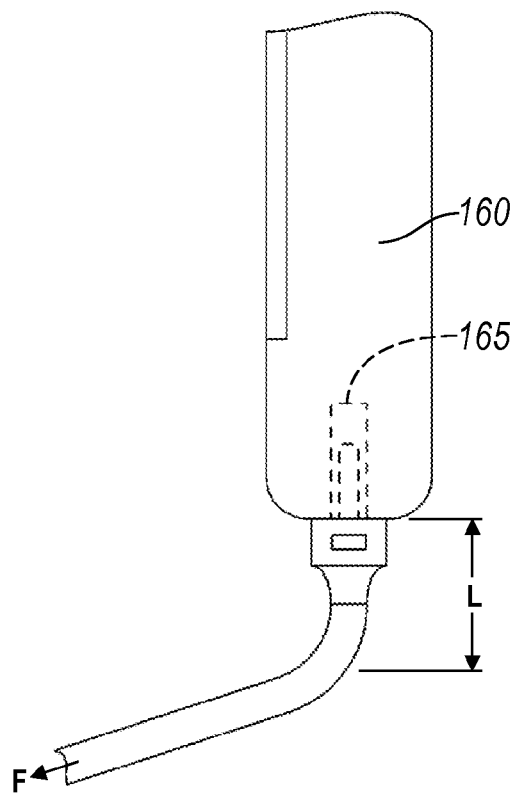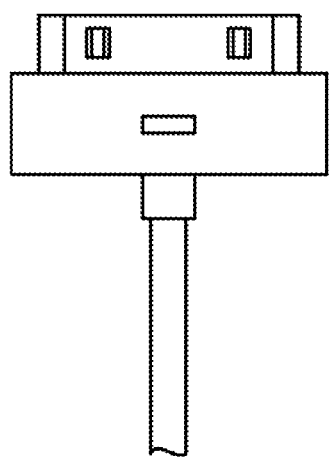

LEASH FOR AN ELECTRONIC DEVICE

BACKGROUND

Handheld electronic devices, including cell phones, smartphones, tablet computers, cameras, personal music (MP3) players, gaming controller, personal gaming devices, are used and carried by users in a wide variety of situations. Users continue to use their electronic devices in exceedingly hazardous environments, from roller coaster rides to snowboarding runs down a slope, despite the known risks involved, such as dropping the electronic device and permanently damaging or losing the device altogether. Thus there is a need in the electronic device accessory field for a new and useful leash to retain an electronic device for a user. This invention provides such a new and useful leash for an electronic device.

FIGURES

FIGS. 1A and 1B include, respectively, side and front elevation views of a leash of a preferred embodiment of the invention;

FIGS. 2A and 2B include isometric views of the leash of the preferred embodiment;

FIG. 7 is a side elevation view of the connector, installed in the data port of the electronic device, of the preferred embodiment;

FIGS. 8 and 9 depict the prior art in the field of data port connectors; and

DETAILED DESCRIPTION

The following description of preferred embodiments of the invention is not intended to limit the invention to these preferred embodiments, but rather to enable any person skilled in the art of to make and use this invention.

Figure 1A:
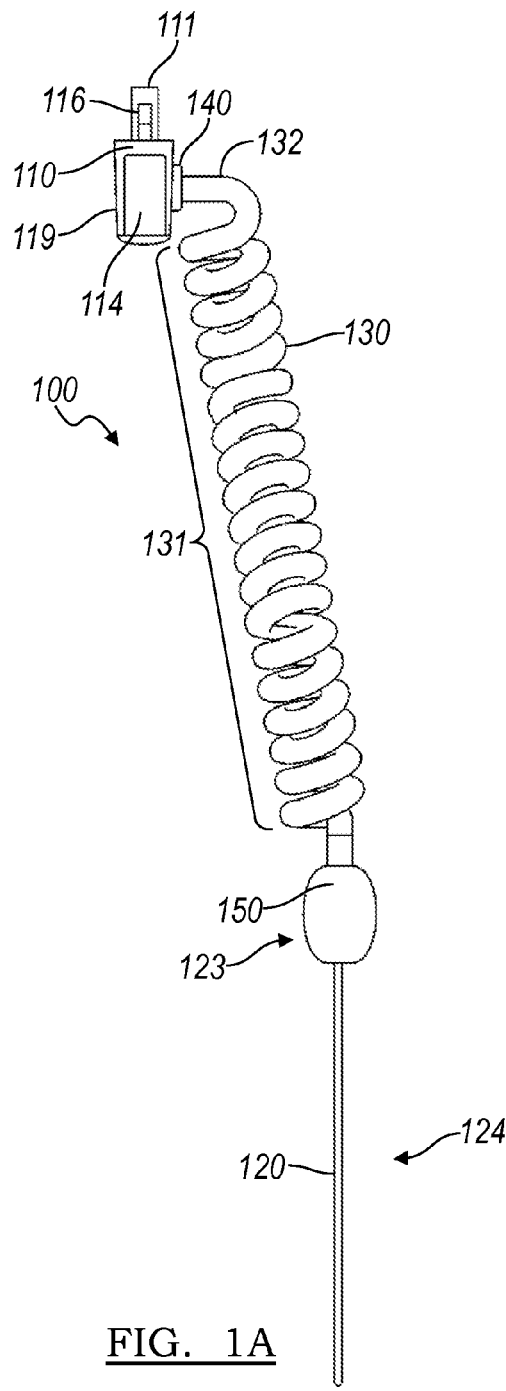
Figure 1B:
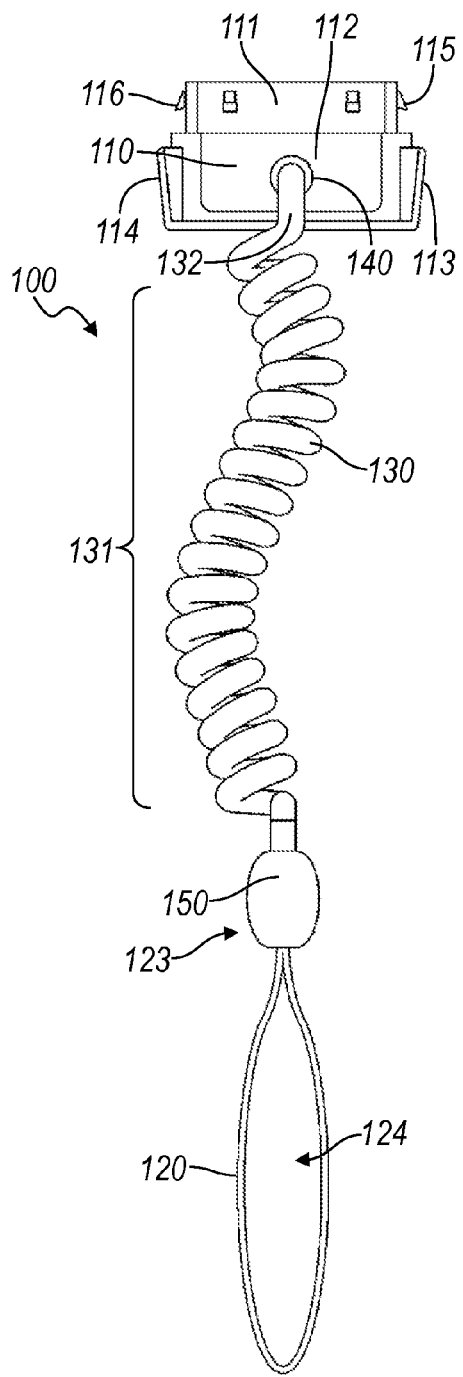

As shown in FIGS. 1A and 1B, the leash 100 for an electronic device 160 with a data port 165, of the preferred embodiment, comprises: a connector 110; a singular cord 120; an elastomeric coating 130; a washer 140; and a protective element 150. The connector 110 includes: a broad face 112; an insertable member 111 adjacent to the broad face 112 and configured to engage the data port 165; and a latch 115, operable by a user, configured to selectively lock the insertable member 111 within the data port 165. The cord 120 includes a first end 121 and a second end 122 and defines a spring-loop junction 123 therebetween, wherein the second end 122 is arranged proximal to the spring-loop junction 123 to form a loop 124; the cord 120, from the spring-loop junction 123 to the second end 122, is herein termed the "loop section" of the cord. The elastomeric coating 130 is arranged over the cord 120 between the first end 121 and the spring-loop junction 123 and defines a spring section 131 of a coil geometry therebetween. The protective element 150 is arranged over the spring-loop junction 123 and the second end 122 of the cord, and the washer 140 couples the first end 121 to the connector 110 with the cord 120 extending from the broad face 112 of the connector. The connector 110 may further include a first detent 113 adjacent to the broad face 112 and coupled to the latch 115, the first detent 113 engageable by the user to release the insertable member 111 from the data port 165; in this variation, the broad face 112 may define a bore 117 through which the cord 120 passes, the bore 117 being more proximal to the insertable member 111 than the first detent 113. The elastomeric coating 130 may also define a linear section 132 between the first end 121 and the spring section 131, as shown in FIGS. 1A and 1B. The cord 120 may also define a first knot 125 proximal to the spring-loop junction 123, wherein the second end 122 is knotted around the cord 120, in a second knot 126, between the first knot 125 and the spring-loop junction 123 to form the loop 124; the second knot 126 may also be arranged on top of the first knot 125, or anywhere else on the cord 120.

Figure 10:
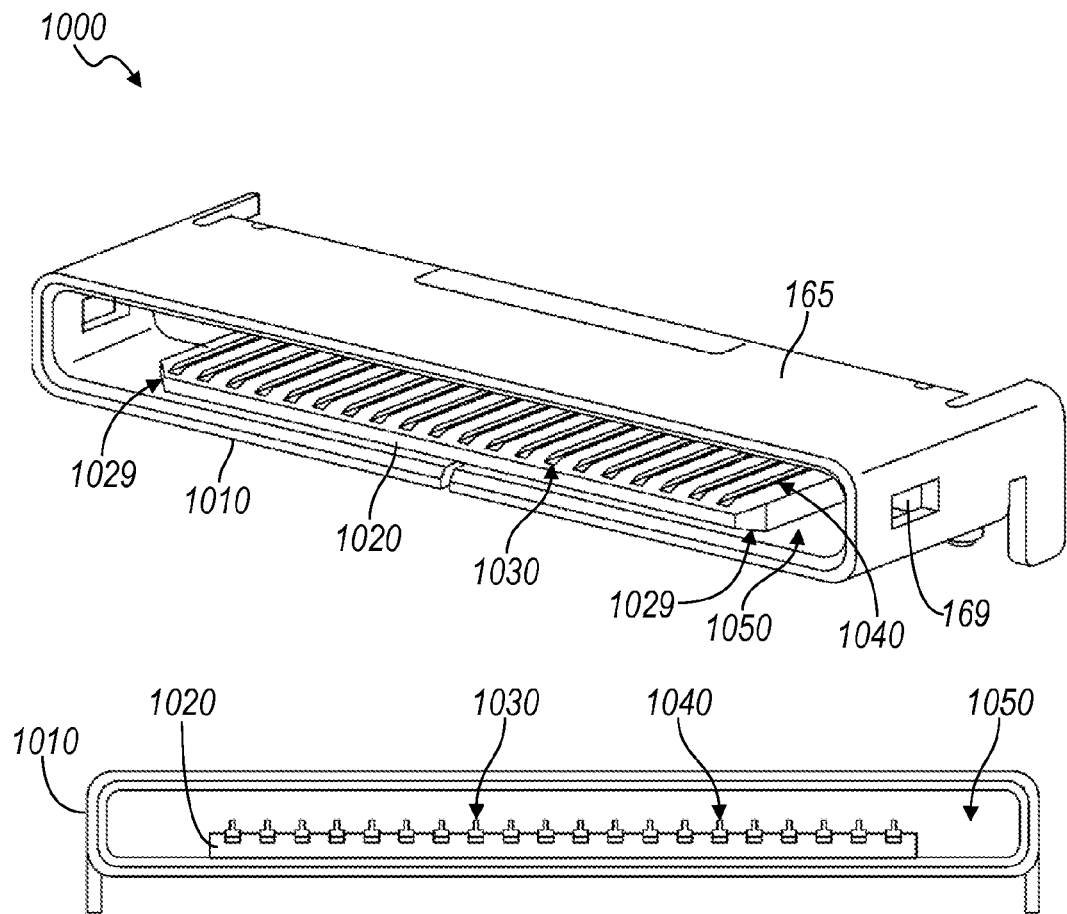
FIG. 10 is an example of a typical data port incorporated into electronic devices.

The user may use the leash 100 of the preferred embodiment to couple an electronic device 160 to an article of clothing worn by the user. The user may pass the loop section of the cord through a belt loop or zipper (or other hole in or element of the article of clothing) and then passes the connector 110 through the loop 124 to secure the leash 100 to the loop or zipper. The user may subsequently insert the insertable member 111 of the connector into a data port 165 of the electronic device 160, the latch 115 locking the insertable member 111 thereto and thus securing the electronic device 160 to the leash 100, the leash, again, being secured to the article of clothing. The electronic device 160 is preferably a smartphone (e.g., an IPHONE), but may also be a cellular phone, a watch, a tablet computer (e.g. an IPAD), a personal music player (i.e. an IPAD), a personal gaming device (e.g., a Sony PSP), a camera, a gaming controller, or any other suitable electronic device that includes a data port accessible by the user; the data port 165 of the electronic device preferably incorporates at least one locking feature 159 by which the latch 115 may lock the connector 110 to the data port 165, as shown in FIG. 10. For example, the data port 165 may be a proprietary 30-pin female receptacle used by Apple, Inc. in a plurality of electronic devices, including the IPOD, the IPHONE, and the IPAD; this receptacle (or a form thereof) is shown in FIG. 10, which is reproduced from U.S. Pat. No. 7,918,689, which issued on 29 Sep. 2009 and is incorporated in its entirety by this reference. However, the data port 165 may be another receptacle of any other type or form, such as a headphone jack, a USB port, a power or charging jack, or any other suitable port. Furthermore, the locking feature 159 may be integral with a housing of the electronic device 160 (e.g., external the data port 165), or arranged on the electronic device 160 in any other way.

Figure 3:
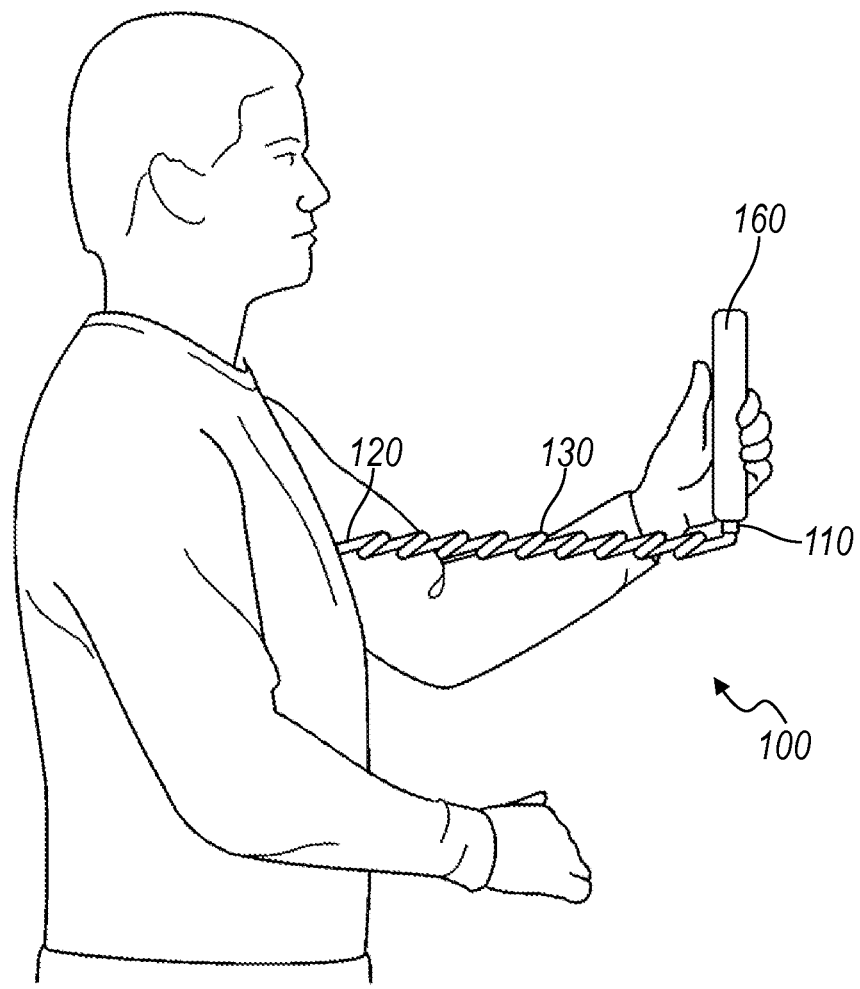
FIG. 3 depicts a usage scenario of the leash, coupled to an electronic device, of the preferred embodiment.

The leash 100 is preferably useful in a variety of applications or environments. In a first usage scenario, the user installs the connector 110 in the data port 165 of a smartphone and attaches the loop section to a breast pocket of a snowboarding jacket (as shown in FIG. 3); the user subsequently takes video with the smartphone while snowboarding down a slope, the leash 100 retaining the smartphone for the user in the event that the user drops the smartphone or the smartphone falls out of a pocket. In a second usage scenario, the user installs the connector 110 in the data port 165 of a smartphone and attaches the loop section to a belt loop; the user subsequently takes pictures with the smartphone while riding a roller coaster, the leash 100 retaining the smartphone for the user in the event that the smartphone is dropped. In a third usage scenario, the user installs the connector no in the data port 165 of a camera and attaches the loop section to a wrist bracelet; the user subsequently takes pictures with the camera while water-skiing behind a boat, the leash 100 retaining the camera for the user in the event that the smartphone is dropped. (In the third usage scenario, the connector no may also provide a seal around the data port 165 to protect the port from water damage.) In a fourth usage scenario, the user installs the connector no in the data port 165 of a smartphone, attaches the loop section to a belt loop, and places the smartphone in a back pant pocket; the user subsequently walks along a crowded street, the leash 100 retaining the smartphone for the user and/or inhibiting a thief in the event that a thief attempts to pickpocket the smartphone. In a fifth usage scenario, the user, who is apt to drop his smartphone, installs the connector no in the data port 165 of the smartphone and attaches the loop section to a belt loop; the leash 100 is of an appropriate length to prevent the smartphone from hitting the floor when the user drops the smartphone, as he is prone to do. However, the leash 100 may be used in any other way or in any other application or environment.

In the above and other usage scenarios, the spring section 131 preferably retracts to a compacted coil form when no or little force is applied along the longitudinal axis of the coil and permits the user to extend the leash 100 (e.g., from approximately 110 mm in length in a retracted state to 850 mm in length in a fully-stretched state, or slightly more that the average length of a human arm in full extension) to allow comfortable and efficient use of the electronic device 160 without separating the leash 100 from the electronic device 160 or the article of clothing. The leash 100 preferably also has a maximum extension that restricts the maximum separation between the electronic device 160 and the user.

Figure 2A:
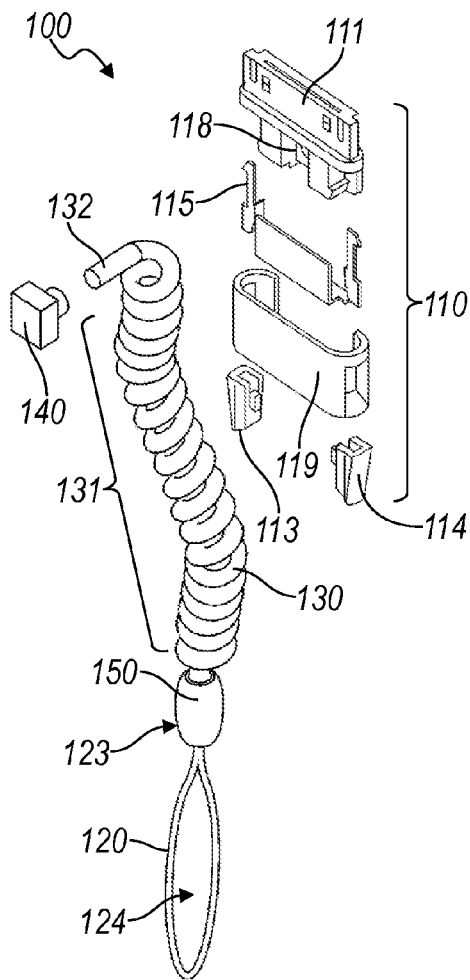
Figure 2B:
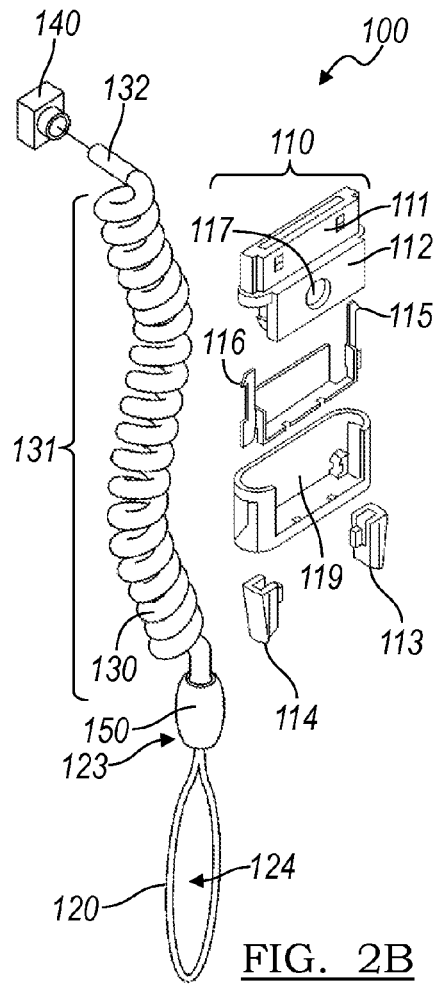

The connector 110 of the preferred embodiment, including the broad face 112, the insertable member 111, and the latch 115, functions as the interface between the cord 120 and the electronic device 160. The connector 110 is preferably configured to selectively lock to the data port 165, wherein the connector 110 is separable from the electronic device 160 substantially only given an intentional positive action (such as by the user) to remove the connector 110 from the electronic device 160, i.e. engaging the latch 115 to release the insertable member 111 from the data port 165. The latch 115 is preferably configured to automatically lock to the data port 165 when the insertable member 111 is placed therein. For example, a separate spring may be coupled to the latch 115, automatically forcing the latch 115 outward to engage a locking feature 159 of the data port 165 (e.g., the locking feature 159 shown in FIG. 10). However, as shown in FIGS. 2A and 2B, the latch 115 and spring are preferably physically coextensive and manufactured by stamping and forming sheetmetal, though the latch 115 may be of any other form or created in any other way. The connector 110 preferably includes at least one latch, but may also include two such latches, as shown in FIG. 2B (115, 116), or any other number of latches. Furthermore, the connector 110 may include a first detent 113 wherein, by pressing the first detent 113, the latch 115 is repositioned and thus released from the locking feature 159 of the data port 165. In the variation of the connector that includes a second latch 116, the connector no may further include a second detent 114 coupled to the second latch 116, as shown in FIG. 2B; in this variation, the first and second detents 113, 114 are preferably arranged on opposite sides of the broad face 112 of the connector and are substantially parallel, as shown in FIG. 1B, wherein the user may squeeze the first and second detents 113, 114 between a thumb and a forefinger to remove the connector no from the data port 165. As shown in FIG. 2A, the two latches 115, 116 are also preferably defined by the same single sheetmetal stamping. The second-generation iPod power cord, by Apple, Inc. and shown in FIG. 9, is an example of an implementation of a connector with such detents, latches, and an insertable member. Though such detents are known and used in the art of data ports and their implementation in the leash 100 of the preferred embodiment will be readily understood by a person of ordinary skill in the art, it will be noted that the mooring of the cord 120 to the connector no is not available in the prior art and would not be readily apparent or obvious to one skilled in the art.

The insertable member 111 and the broad face 112 of the connector are preferably a unitary structure, as shown in FIG. 2B, which may have the benefit of improving the strength of the connection between the electronic device 160 and the cord 120. Though the connector 110 may otherwise include a plurality of other components (as shown in FIG. 2B), because the broad face 112 and the insertable member 111 are formed as one unitary structure rather than being two separate structures ultimately welded, bonded, or otherwise assembled, the unitary structure of the broad face 112 and insertable member 111 may be less likely to fail over a similar component assembled from multiple pieces; this may be beneficial since mechanical failure between the insertable member 111 and the broad face 112 may reduce the effectiveness of the leash 100 in retaining the electronic device 160 if dropped, released, or otherwise separated from the user. The broad face 112 and the insertable member 111 are preferably injection molded as a single structure and are preferably of a polymer material, such as nylon, delrin, high-density polyethylene (HDPE), acetal, acrylonitrile butadiene styrene (ABS), polyvinyl chloride (PVC), polystyrene (PS), polypropylene (PP), or any other suitable plastic or polymer. However, the broad face 112 and the insertable member 111 may be of any other material, such as brass, zinc, steel, aluminum, silicon, polyester, Kevlar, fiberglass, or polyurethane, and may be manufactured in any other way, such as by die casting, investment casting, die forming, stamping, or molding, or by any other suitable manufacturing process. Furthermore, the broad face 112 is preferably planar and substantially in-plane with the intended direction of insertion of the insertable member 111 into the data port 165 of the electronic device 160, as shown in FIGS. 1A and 7. However, the broad face 112 may be of any other form and of any other position relative to the insertable member 111.

The cord 120 of the preferred embodiment functions as an extendible link between the article of clothing worn by the user and the connector no. The spring section 131 and the loop section (and the linear section 132, in some variations) comprise the unitary cord 120 such that a continuous structure passes from the first end 121 at the connector 110, (through the linear section 132,) through the spring section 131, through the loop section, to the second end 122. This continuous structure may reduce the susceptibility of the leash 100 to failure modes common to conventional similar leashes. One common failure mode for conventional leashes in the prior art has been a junction between an extendible component (e.g., the spring section) and a connector, clip, hook, or other element for coupling the leash to the user; the interface of two disparate elements along the leash, whether or not of the same materially, typically leads to a weak point in the leash assembly. Therefore, the continuous structure (i.e. the unitary cord 120) passing from the first end 121 to the second end 122 may provide the benefit of a more robust leash in comparison to conventional leashes.

Figure 5:
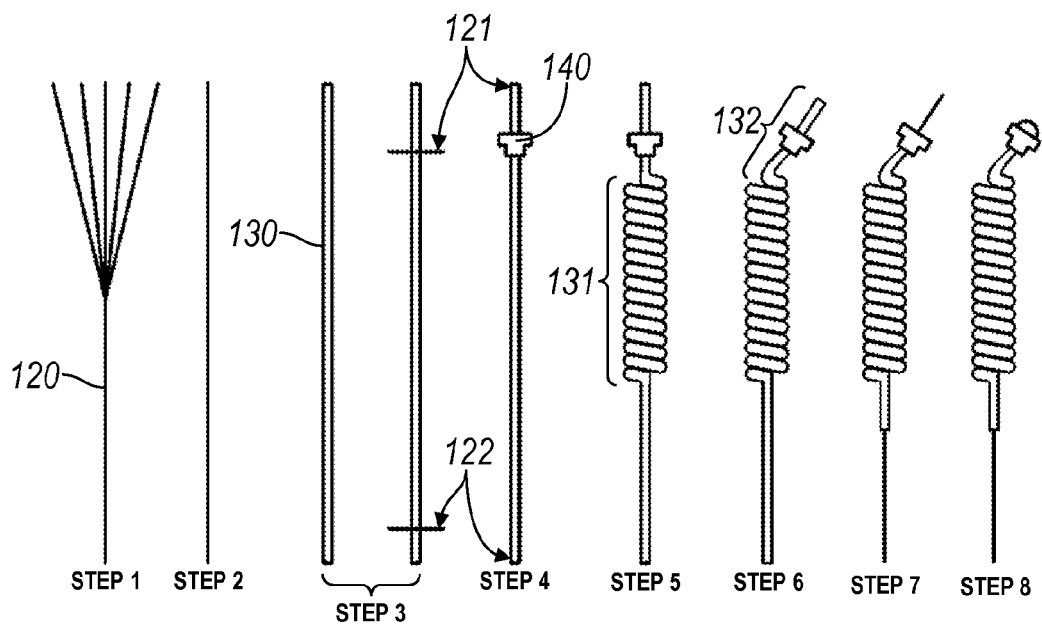
FIG. 5 depicts manufacturing steps for the coil section of the leash of the preferred embodiment.

The cord 120 is preferably a fibrous cord, such as a woven string, and preferably has limited capacity for stretching but is capable of withstanding at least the tensile forces applied to the leash 100 under normal use conditions without fraying, splitting, severing, or otherwise failing. The cord 120 is preferably woven Kevlar, as shown in FIG. 5, but may alternatively be nylon, delrin, Teflon, polyethylene (PE), polyvinylidene fluoride (PVDF), ultra-high molecular weight polyethylene (UHMWPE), or any other suitable material and may or may not be woven. The cord 120 is also preferably of a material resistant to degradation in the presence of ultraviolet (UV) radiation (e.g., sunlight), such as PVDF. However, the cord 120 may be of a material with relatively low UV-resistance, such as Kevlar, but coated with a UV-resistant material or wrapped in a UV-resistant material (e.g., a PVDF sleeve over a Kevlar core); such a coating or wrap may be applied only over the loop section of the cord or, alternatively, over the entire length or other portion of the cord. However, the cord 120 may be of any other suitable material and/or combination of materials, and the cord 120 may also include one or more layers of similar or dissimilar material(s) arranged about a fibrous core.

The elastomeric coating 130 of the preferred embodiment, defining the spring section 131, functions to extend from a compacted coil (e.g., from the retracted state to an extended state) to allow the user to operate the electronic device 160 without separating the leash 100 from the electronic device 160 or the leash from the article of clothing. The spring section 131 is preferably formed by coating a section of the coil in the elastomeric coating 130 and forming the spring section 131 into the coil geometry. The elastomeric coating 130 is preferably thermoplastic polyurethane (TPU), but may alternatively be rubber, nylon, chlorosulfonated polyethylene (CSM), nitrile butadiene rubber (NBR), PVC, a NBR/PVR blend, or any other suitable material. The elastomeric coating 130 is preferably elastic and has shape memory such that the elastomeric coating 130 preferably: retains the shape of the retracted coil in the absence of a substantial tensile force applied along the longitudinal axis of the coil; is prone to return to the original coil geometry in the absence of such a force; and permits extension of the coil, in the presence of such a substantial force, without substantial fatigue, display of wear, cracking, or other failure. The elastomeric coating 130 preferably also has the following properties: color permanence; ozone-resistance; weather-resistance; UV-resistance; heat-resistance (e.g., to melting at temperatures above 100° C.); cold-resistance (e.g., to cracking under manipulation at temperatures below −20° C.); resistance to a wide range of chemicals; resistance to abrasion and mechanical abuse; and suitable adhesion to the cord 120. However, the elastomeric coating 130 may have any other property.

The elastomeric coating 130 further functions to define the spring section 131 that is a coil of circular geometry (e.g., 8.5 mm in outer diameter), as shown in FIGS. 1A and 2A; however, the spring section 131 may be a coil of rectilinear or elliptical geometry, or of any other suitable geometry. The elastomeric coating 130 is preferably of a uniform circular cross-section over the spring section 131 (e.g., approximately 3 mm in diameter), as shown in FIG. 2A, but may alternatively be rectilinear or elliptical in cross-section, or of any other geometry. However, the elastomeric coating 130 may not be uniform in cross-section over the length of the spring section 131; for example, the cross-section of the spring section 131 may taper from 2 mm proximal to the first end 121 to 5 mm in diameter proximal to the middle of the spring section 131 and back to 2 mm proximal to the spring-loop junction 123. Furthermore, the spring section 131 is preferably between 100 mm and 120 mm in length in the retracted state and capable of between 800 mm and 900 m maximum length in the fully-stretched state. However, the geometry of the elastomeric coating 130 and the spring section 131 may be of any other form and of any other dimension, and the spring section 131 may be of any other length in the retracted state and/or fully-expanded state.

Figure 6:
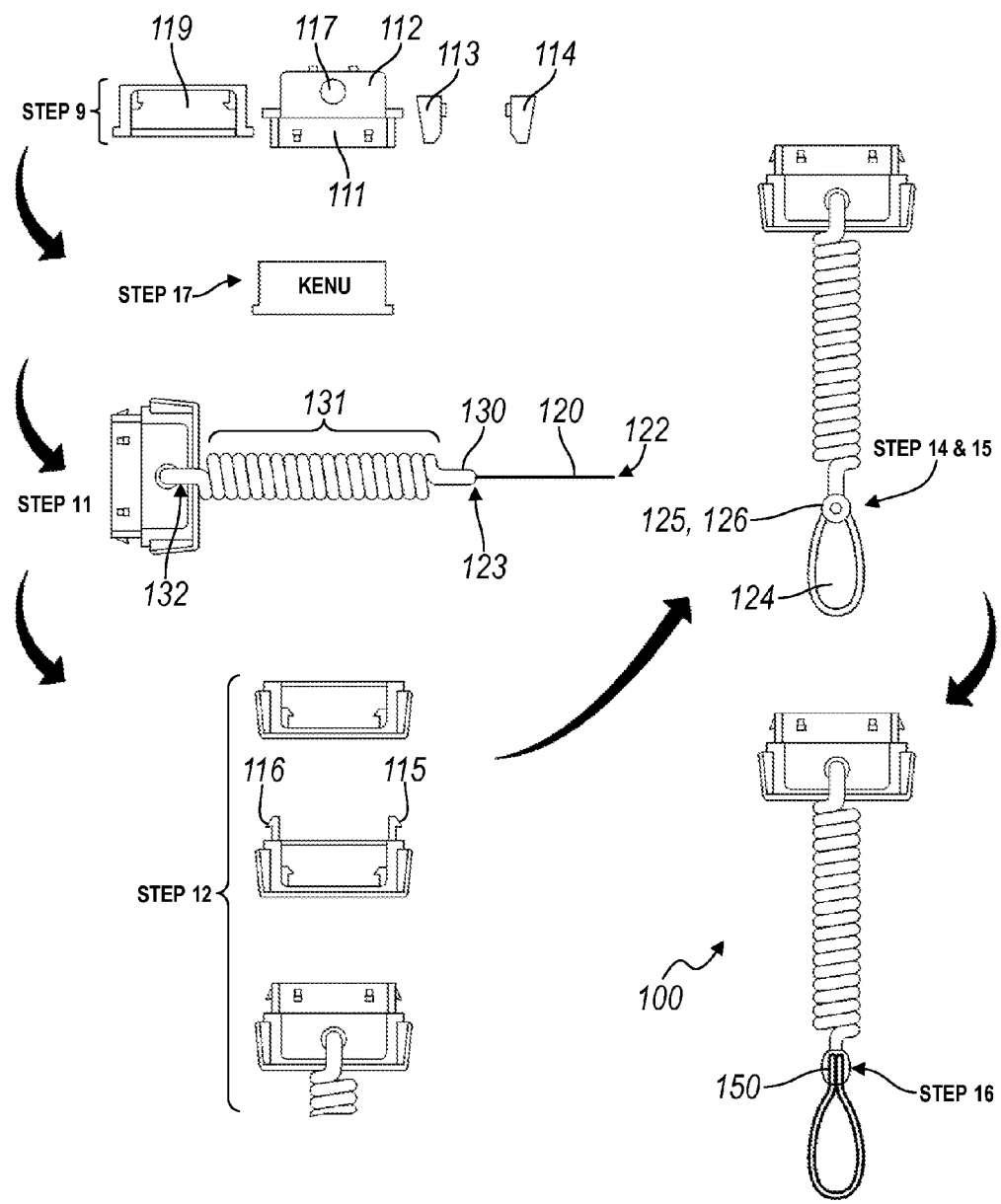
FIG. 6 depicts manufacturing steps for the leash of the preferred embodiment.

In the variation of the elastomeric coating 130 that defines the linear section 132 between the first end 121 and the spring section 131, the coating on the linear section 132 is preferably of the same cross-section as the coating on the spring section 131 and continuous with the coating on the spring section 131 (e.g., the coatings on both sections are formed and/or applied simultaneously, as shown in FIG. 5). The linear section 132 preferably passes through a bore 117 in the broad face 112 of the connector (as shown in FIG. 2B) and is moored thereto, wherein the linear section 132 defines a gap between the connector no and the spring section 131 such that the connector no does not substantially interfere with or substantially rub on the spring section 131 during normal use. In other words the linear section 132 functions to separate the spring section 131 from the connector no to provide a transition region between the connector no and the spring section 131 that centers the spring section 131 on the connector no and properly defines the direction that the spring section 131 extends from the connector no, as shown in FIGS. 1A, 1B, and 6.

The elastomeric coating 130 preferably covers the cord 120 from the first end 121, (over the linear section 132,) over the spring section 131, to the spring-loop junction 123, as shown in FIGS. 2A and 2B. In one variation of the leash 100, the cord 120 further defines a knot, proximal to the first end 121, that functions to mechanically retain the washer 140 on the cord 120 (i.e. to prevent the washer 140 from sliding past the first end 121), as shown in FIG. 5. In this variation, the knot is preferably defined by a section of the cord not coated in the elastomeric material, and the knot is preferably coated in an adhesive. In an alternative variation, a bead is joined to the cord 120, proximal to the first end 121, to mechanically retain the washer 140 on the cord 120; the bead may be crimped, bonded, or otherwise joined to the cord 120. The bead may be arranged over a portion of the cord already coated with the elastomeric coating 130, but is preferably arranged over a portion of the cord not coated with the elastomeric coating 130.

The washer 140 of the preferred embodiment, functions to mechanically moor the cord 120 to the connector 110. As described above, the washer 140 is preferably retained on the cord 120 mechanically, such as by a knot or bead proximal to the first end 121 of the cord. In a first example of a manufacturing method of the cord 120 shown in FIG. 5: (STEP 1) the cord 120 is woven from Kevlar strands; (STEP 2) TPU (the elastomeric coating 130) is extruded over the cord 120; (STEP 3) the washer 140 is molded over the elastomeric coating 130 proximal to the first end 121; (STEP 4) the spring section 131 is wrapped around a metal wire and baked to form the circular coil geometry; (STEP 5) the cord proximal to the first end 121 is shaped to create the linear section 132 and baked; (STEP 6) the elastomeric coating is stripped from the cord 120 between the first end 121 and the washer 140, as well as from the loop section; and (STEP 7) a knot is created between the first end 121 and the washer 140 and coated in an adhesive. The second end 122 of the cord may then be threaded through the bore 117 of the broad face 112 and the cord 120 pulled therethrough until the washer bottoms on the opposite the broad face, the washer preventing the second end 122 from passing through the connector 110 (STEP 11). In a second example of a manufacturing method similar to the previous example: STEP 6 follows STEP 2, and STEP 3 is replaced by crimping the washer 140 that is steel to the cord 120 proximal to the first end 121. However, the washer 140 may be mechanically fastened to the cord 120 in any other way, such as with a knot or by directly crimping the washer 140 to the cord 120; alternatively, the washer 140 may be coupled to the cord 120 by adhering, gluing, bonding, fusing, welding, or other chemical joining. The washer 140 may also be physically coextensive with the broad face 112.

In a first variation of the washer 140, the second end 122 of the cord is passed from the inside of the broad face 112 and through the bore 117 of the broad face 112; the cord 120 is then pulled though the broad face 112 until the washer 140 engages the inside of the broad face 112, the washer 140 thus retaining the first end 121 within the connector 110. In this variation, the connector 110 preferably includes a locating feature 118 (as shown in FIG. 2A) that retains the washer 140 in a given orientation; this may provide the benefit of maintaining the orientation of the portion of spring section 131 (or the linear section 132) emanating from the broad face 112, the connector 110 thus always appropriately positioned for ease of insertion of the insertable member 111 into the data port 165 of the electronic device 160. The washer 140, therefore, preferably includes a feature or is of an appropriate geometry to engage the locating feature 118, such as the rectilinear washer shown in FIG. 2A.

In a second variation of the washer 140, the washer 140 engages an external feature on the broad face 112 of the connector, such as a recess, a hook, a latch, or other suitable feature, the washer 140 thus moored to the broad face 112 external to the connector no. However, the washer 140 and the broad face 112 may be physically coextensive, wherein the washer 140 of the broad face 112 is crimped, bonded, welded, or otherwise joined to the cord 120 directly, or the washer 140 may be of any other geometry and coupled to the connector 110 in any other way.

The washer 140 preferably orients the cord 120 such that the cord 120 protrudes from the broad face 112 in a direction substantially perpendicular to the direction of insertion of the insertable member 111 into the data port 165. In the variation of the broad face 112 that is planar and substantially in-plane with the direction of insertion of the insertable member 111 into the data port 165, the washer 140 preferably orients the cord 120 to protrude from the broad face 112 in a direction substantially normal to the broad face 112. The washer 140 also preferably couples the cord 120 to the connector 110 substantially proximal to the insertable region, which may reduce the lever arm length (e.g., the distance between the cord-connector joint and the insertable member 111) of the leash 100 and thus reduce the magnitude of torques applied to the data port 165 under normal use. By so orienting the cord to protrude from the broad face 112 and substantially near the insertable member 111, as shown in FIG. 7, torques exerted by the connector no on the data port 165 during normal use may be minimized; this is desirable as excessive torques applied to the data port 165 may result in damage to the data port 165. The cord-connector orientation of the preferred embodiment, as shown in FIG. 7, may therefore offer significant benefits over the connector-cord arrangements of the prior art, which are typified by FIGS. 8 and 9.

Typically, data ports integrated into electronic devices are configured to receive a plug (or other adapter) inserted in a direction in plane with a display screen (or keyboard or user input region) of the electronic device, as shown in FIGS. 7 and 8. FIGS. 8 and 9 depict the prior art in the field of data port plugs, wherein the typical orientation of a cable or cord on the plug is opposite the insertable member of the plug, the cable or cord emanating from the plug along the direction of intended insertion of the insertable member into the data port. Such an orientation of the cord on the connector, when applied to the leash 100 of the preferred embodiment, is likely to result in torques of undesired magnitudes applied to the data port when the leash is used in conjunction with the electronic device, such as in the usage scenario shown in FIG. 3. Therefore, the cord 120 is preferably coupled to the connector 110, as shown in FIG. 7, with the cord 120 moored to the connector 110 in a direction perpendicular to the intended direction of insertion of the insertable member 111 into the data port 165. The washer 140 preferably so couples the cord 120 to the connector 110.

The cord 120 of the preferred embodiment further functions to define the loop 124, opposite the connector no, wherein the user may use the loop 124 to couple the leash 100 to an article of clothing or other device, element, or article. To form the loop 124, the second end 122 of the cord is arranged proximal to the spring-loop junction 123. In a first variation, the second end 122 is knotted around the cord 120 proximal to the spring-loop junction 123, the knot thus maintaining the location of the second end 122 proximal to the spring-loop junction 123. In a second variation, the cord 120 defines a first knot 125 proximal to the spring-loop junction 123, as shown in STEP 14 of FIG. 4; the second end 122 is then knotted around the cord 120, in a second knot 126, between the first knot 125 and the spring-loop junction 123, as shown in STEP 15 of FIG. 4. This second variation of the loop 124, including the first and second knots 125, 126, may have the benefit of being more secure over alternative geometries, since the application of a tensile force to the loop 124 tightens the first knot 125, which prevents the second knot 126 from sliding along the cord 120, past the second knot 126, and away from the spring-loop junction 123.

Figure 4:
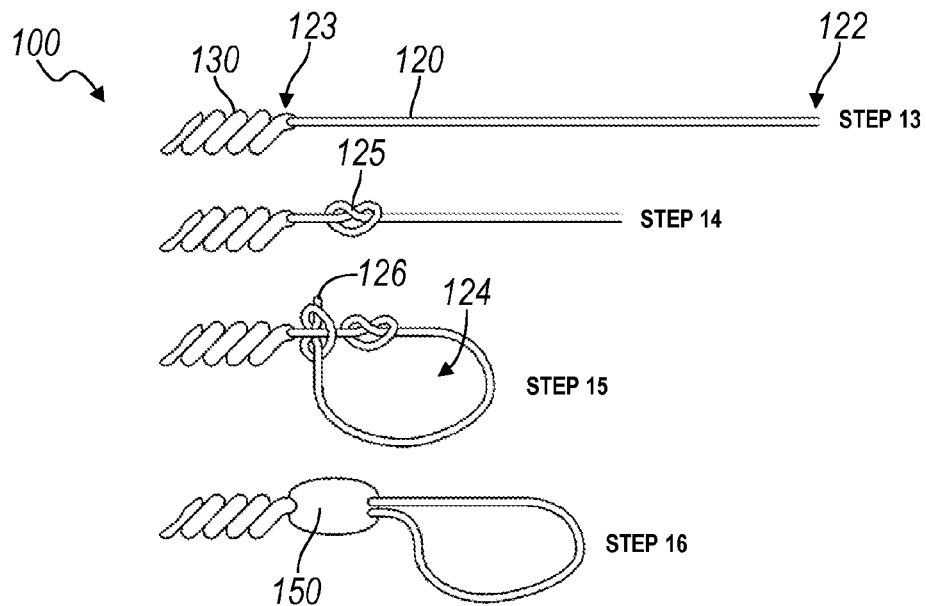
FIG. 4 depicts manufacturing steps for the loop section of the leash of the preferred embodiment.

Prior to arrangement of the second end 122 of the cord proximal to the spring-loop junction 123, the loop section is preferably cut to length, as shown in STEP 13 of FIG. 4, such that, when the leash 100 is assembled, the connector 110 may pass fully through the loop 124.

The protective element 150 of the preferred embodiment, shown in FIGS. 1A and 1B, functions to: prevent the end of the elastomeric coating 130, terminating at the spring-loop junction 123, from peeling away from the cord 120; and to protect the second end 122 of the cord to prevent inadvertent destruction of the coupling between the second end 122 and the spring section 131. The protective element 150 is preferably of a polymer, such as nylon, acetal, ABS, PTFE, PE, PS, PP, HDPE, UHMWPE, Bakelite, silicone, rubber, latex, or any other suitable polymer or plastic, and is preferably overmolded over the spring-loop junction 123, including over the end of the elastomeric coating 130 and the second end 122 of the cord. However, the protective element 150 may be of any other material, such as an elastomer or metal, and may be assembled over the spring-loop junction 123 and second end 122 in any other way; for example, the protective element 150 may be crimped in place over the cord 120 or assembled from two or more disparate pieces over the cord 120. Furthermore, in the variation in which the second end 122 is not knotted to the cord 120, the protective element 150 may provide the sole means of retention of the second end 122 in the proper location proximal to the spring-loop junction 123.

The leash 100 is preferably manufactured by the following steps, as shown in FIGS. 4-6: (STEP 1) weave Kevlar strands into the cord 120 of approximately 0.8 mm width (or diameter); (STEP 2) coat the Kevlar cord 120 with a thin UV-resistant coating and cut the cord to length; (STEP 3) extrude TPU (the elastomeric coating 130) over the cord 120; (STEP 4) injection mold the washer 140, from ABS, over the elastomeric coating 130 proximal to the first end 121; (STEP 5) wrap the spring section 131 around a metal wire and bake the cord 120 to form the circular coil geometry of the spring section 131; (STEP 6) shape the cord 120 proximal to the first end 121 to create the linear section 132 and bake the cord 120; (STEP 7) strip the elastomeric coating 130 from the cord 120 between the first end 121 and the washer 140, as well as from the loop section; (STEP 8) create two knots between the first end 121 and the washer 140 and coat the knots in an adhesive; (STEP 9) injection mold the components of the connector 110, including the broad face 112 and insertable member 111, two detents 113, 114, and a rear housing 119, from ABS pellets, including colorant (e.g., black); (STEP 10) stamp and form two physically coextensive latches 115, 116 from stainless steel sheet; (STEP 11) pull second end 122 of the cord through the bore 117 of the broad face until the washer 150 engages back side of the broad face 112 washer 140; (STEP 12) assemble the connector 110 by installing the latches 115, 116, installing the detents 113, 114, and ultrasonically welding the rear housing 119 in place; (STEP 13) trim the cord 120 to length at the second end 122; (STEP 14) form a first knot 125 in the loop section proximal to the spring-loop junction 123; (STEP 15) form a second knot 126, with the second end 122, between the spring-loop junction 123 and the first knot 125; (STEP 16) injection mold the protective element 150, from ABS pellets, including colorant, over the spring-loop junction 123 and first and second knots 125, 126. These steps may be performed in any suitable order and may be replaced by any other suitable manufacturing method, material, or step. Any additional steps may also be added to the manufacturing process for the leash 100, such as (STEP 17) printing a colored logo on the connector 110 opposite the broad face 112, either before or after assembly of the connector, or gluing the washer to the inside of the broad face 112.

The leash 100 may also include additional features. In a first variation, the washer 140 is configured to break away from the cord 120 given a force greater than a threshold maximum force, wherein a force significantly greater than the threshold maximum force, when applied to the data port 165 of the electronic device 160, will likely result is significant damage to the electronic device 160. Alternatively, the washer 140 may be configured to break away from the connector 110, the connector 110 may be configured to disintegrate, or the latch 115 may be configured to release in the presence of a force greater than the threshold maximum force. By incorporating such a feature, damage to the electronic device 160 may be limited when in use with the leash 100. In a second variation, the clip may include active or passive circuitry to transmit data to the electronic device 160, through the data port 165, when installed therein. In a first example, when the connector 110 is installed in the data port 165, a camera or music application of the electronic device 160 is automatically opened (or a feature thereof automatically adjusted). In a second example, the connector no acts as a key for an application executing on the electronic device 160, wherein the user must insert the connector no in the data port 165 of the electronic device 160 in order to access the application in general or one or more features of the application. In potential scenario of this second example, a roller coaster ride provides leashes 100 of the preferred embodiment to individuals riding the roller coaster; an individual who installs the leash 100 to an article of clothing and to the data port 165 of his smartphone may use an application thus unlocked to take pictures while riding the roller coaster, wherein the unlocked application automatically transmits the pictures to an onsite database that collects the images and provides tangible, large format prints to riders of the roller coaster following the ride. In a third example, the connector no includes sensors (powered by the electronic device 160 through the data port 165) configured to detect failure of the leash 100; the electronic device 160 monitors the sensors and, given an assertion of leash failure, sounds an audible alarm and/or initiates a GPS honing beacon to aid the user in tracking down the electronic device 160. In a variation of this third example, the connector 110 may simply include a conductive element that couples two pins of the data port 165, the electronic device 160 recognizing low resistance between the two pins as indicative that the connector 110 is installed in the data port 165 and high resistance between the two pins as indicative that the connector no has been removed therefrom. In a fourth example, the leash 100 includes an electric generator that produces current as the spring section 131 stretches and retracts under normal usage; this current is directed from the connector 110 into the data port 165 to charge the electronic device 160. However, the leash 100 may incorporate any other active or passive circuitry to augment the functionality of the leash 100 and/or the electronic device 160.

As a person skilled in the art will recognize from the previous detailed description and from the figures and claims, modifications and changes can be made to the preferred embodiments of the invention without departing from the scope of this invention as defined in the following claims.

The invention claimed is:

1. A leash for an electronic device with a data port, comprising:
    a display;
    a connector including a broad face on a plane, an insertable member adjacent to the broad face and configured to engage the data port, wherein the insertable member further includes a latch configured to selectively lock the insertable member to the data port;
    a singular cord including a first end and a second end and defining a spring-loop junction there between, wherein the second end is arranged proximal to the spring-loop junction to form a loop;
    an elastomeric coating arranged over the cord between the first end and the spring-loop junction, the elastomeric coating defining a spring-section of a coil geometry there between, the elastomeric coating having the properties of color permanence, ozone-resistance, and cold-resistance, the spring-section being between 100 millimeters and 120 millimeters in length in a retracted state, and capable of between 800 millimeters and 900 millimeters maximum length in a fully-stretched state;
    a protective element arranged over the spring-loop junction and the second end of the cord; and
    a washer coupling the first end of the singular cord to the connector, the first end of the singular cord extending from the broad face of the connector and through the spring-section and spring-loop junction to the second end of the singular cord, wherein the first end of the singular cord extends from the broad face of the connector in a direction perpendicular to the plane that the broad face is on, and perpendicular to the intended direction of insertion of the insertable member into the data port.

2. The leash of claim 1, wherein the cord comprises a fibrous material.

3. The leash of claim 2, wherein the cord is composed of at least one woven para-aramid synthetic fiber.

4. The leash of claim 3, wherein the loop is coated in a UV-resistant material.

5. The leash of claim 1, wherein the elastomeric coating is a thermoplastic polyurethane.

6. The leash of claim 5, wherein the elastomeric coating extends from the first end, over the spring section, and up to the spring-loop junction and is substantially uniform in cross-section thereon.

7. The leash of claim 1, wherein the loop is of a size permitting the connector to pass fully through the loop.

8. The leash of claim 1, wherein the spring section is of a circular coil geometry.

9. The leash of claim 1, wherein the protective element is molded over the spring-loop junction and the second end of the cord.

10. The leash of claim 1, wherein the cord further comprises a first knot proximal to the spring-loop junction and the second end is knotted around the cord, in a second knot between the first knot and the spring-loop junction.

11. The leash of claim 1, wherein the cord passes through the broad face of the connector and the washer retains the first end within the connector.

12. The leash of claim 11, wherein the broad face defines arbore, and wherein the elastomeric coating further defines a linear section between the first end and the spring section the linear section passing through the bore perpendicular to the intended direction of insertion of the insertable member into the data port of the electronic device.

13. The leash of claim 11, wherein the cord further comprises a not proximal to the first end and retaining the washer on the cord.

14. The leash of claim 13, wherein the knot is coated in an adhesive.

15. The leash of claim 1, wherein the cord includes a linear section between the first end and the spring section coated in the elastomeric material and joined to the connector to extend therefrom in a direction substantially perpendicular to the intended direction of insertion of the insertable member into the data port of the electronic device.

16. The leash of claim 1, wherein the connector further comprises at first detent adjacent to the broad face the first detent coupled to the latch and engageable by the user to release the insertable member from the data port.

17. The leash of claim 16, wherein the connector further comprises a second latch operable by the user and configured to selectively lock the insert able member to the data port, the connector further comprising a second detent adjacent to the broad face opposite the first detent, the second detent coupled to the second latch and engage able by the user to release the insertable member from the data port.

18. The leash of claim 16, wherein the broad face defines arbore through which the cord passes, the bore being more proximal to the insertable member than the first detent.

19. A leash for an electronic device with adaptor, comprising:
  a display;
  a connector including a broad face that is parallel to a plane of the display, an insertable member adjacent to the broad face and configured to engage the data port, and a latch, operable by a user, configured to selectively lock the insertable member to the data port;
  a singular cord including a first end and a second end the cord defining as a spring-loop junction there between and a first knot proximal to the spring-loop junction, wherein the second end is knotted around the cord, in a second knot between the first knot and the spring-loop junction to form a loop;
  an elastomeric coating arranged over the cord between the first end and the spring-loop junction the elastomeric coating defining a spring section of a coil geometry and a linear section between the first end and the spring section, the elastomeric coating having the properties of color permanence, ozone-resistance, and cold-resistance, the spring-section being between 100 millimeters and 120 millimeters in length in a retracted state, and capable of between 800 millimeters and 900 millimeters maximum length in a fully-stretched state;
  a protective element arranged over the spring-loop junction, the first knot, and the second end of the cord; and
  a washer retaining the first end of the singular cord within the connector, the the singular cord passing through the broad face in a direction substantially perpendicular to the plane that is parallel to the broad face and extending from the broad face and through the spring-section and spring-loop junction to the second end of the singular cord.

20. A leash for an electronic device with an adaptor, comprising:
  a display;
  a connector including a broad face that is parallel to a plane of the display, an insertable member adjacent to the broad face and configured to engage the data port, and a latch, operable by a user, configured to selectively lock the insertable member to the data port;
  a singular cord including a first end and a second end the cord defining as a spring-loop junction there between and a first knot proximal to the spring-loop junction, wherein the second end is knotted around the cord, in a second knot between the first knot and the spring-loop junction to form a loop;
  an elastomeric coating arranged over the cord between the first end and the spring-loop junction the elastomeric coating defining a spring section of a coil geometry and a linear section between the first end and the spring section, the elastomeric coating having the properties of color permanence, ozone-resistance, and cold-resistance, the spring-section being between 100 millimeters and 120 millimeters in length in a retracted state, and capable of between 800 millimeters and 900 millimeters maximum length in a fully-stretched state;
  a protective element arranged over the spring-loop junction, the first knot, and the second end of the cord; and
  a washer retaining the first end of the singular cord within the connector, the linear section passing through the broad face in a direction substantially perpendicular to the plane that is parallel to the broad face, and the first end of the singular cord extending from the broad face of the connector and through the spring-section and spring-loop junction to the second end of the singular cord.

* * * * *